(12) United States Patent
Tsai et al.

(10) Patent No.: US 11,430,739 B2
(45) Date of Patent: Aug. 30, 2022

(54) STRUCTURE AND FORMATION METHOD OF PACKAGE STRUCTURE WITH FAN-OUT STRUCTURE

(71) Applicant: Taiwan Semiconductor Manufacturing Co., Ltd., Hsinchu (TW)

(72) Inventors: Po-Hao Tsai, Zhongli (TW);
Hsien-Wen Liu, Hsinchu (TW);
Shin-Puu Jeng, Hsinchu (TW);
Meng-Liang Lin, Hsinchu (TW);
Shih-Yung Peng, Hsinchu (TW);
Shih-Ting Hung, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 245 days.

(21) Appl. No.: 16/437,297

(22) Filed: Jun. 11, 2019

(65) Prior Publication Data
US 2020/0135653 A1    Apr. 30, 2020

Related U.S. Application Data

(60) Provisional application No. 62/752,387, filed on Oct. 30, 2018.

(51) Int. Cl.
*H01L 21/56* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 21/6835; H01L 21/4889; H01L 21/4853; H01L 21/568; H01L 21/5389; H01L 2221/68304; H01L 2221/68345; H01L 2221/6853; H01L 2221/68359; H01L 2221/68372; H01L 23/49811; H01L 23/49816; H01L 23/49822; H01L 23/49827; H01L 23/49833; H01L 23/49838; H01L 23/5226; H01L 23/538; H01L 23/5383–5386; H01L 2224/73204; H01L 2224/83203–83204; H01L 2224/81345; H01L 2224/16059
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |

(Continued)

*Primary Examiner* — Lauren R Bell
(74) *Attorney, Agent, or Firm* — McClure, Qualey & Rodack, LLP

(57) ABSTRACT

Structures and formation methods of a package structure are provided. The method includes forming a conductive structure over a carrier substrate and disposing a semiconductor die over the carrier substrate. The method also includes pressing a protective substrate against the carrier substrate at an elevated temperature to bond the protective substrate to the conductive structure. The method further includes forming a protective layer to surround the semiconductor die.

20 Claims, 16 Drawing Sheets

(51) Int. Cl.
   *H01L 21/683*   (2006.01)
   *H01L 23/538*   (2006.01)
   *H01L 23/31*    (2006.01)
   *H01L 23/498*   (2006.01)

(52) U.S. Cl.
   CPC .......... *H01L 21/565* (2013.01); *H01L 21/568* (2013.01); *H01L 21/6835* (2013.01); *H01L 23/3128* (2013.01); *H01L 23/3142* (2013.01); *H01L 23/49811* (2013.01); *H01L 23/49816* (2013.01); *H01L 23/49833* (2013.01); *H01L 23/5383* (2013.01); *H01L 23/5385* (2013.01); *H01L 23/5386* (2013.01); *H01L 2221/68345* (2013.01)

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2009/0008765 A1* | 1/2009 | Yamano ............... H01L 23/3114 257/690 |
| 2014/0167253 A1* | 6/2014 | Tseng ................... H01L 23/488 257/737 |
| 2016/0056087 A1* | 2/2016 | Wu ................... H01L 23/49833 257/738 |
| 2017/0084541 A1* | 3/2017 | Hsu ........................ H01L 23/50 |
| 2017/0207199 A1* | 7/2017 | Kira ........................ H01L 24/83 |

\* cited by examiner

STRUCTURE AND FORMATION METHOD OF PACKAGE STRUCTURE WITH FAN-OUT STRUCTURE

PRIORITY CLAIM AND CROSS-REFERENCE

This application claims the benefit of U.S. Provisional Application No. 62/752,387, filed on Oct. 30, 2018, the entirety of which is incorporated by reference herein.

BACKGROUND

Semiconductor devices are used in a variety of electronic applications, such as personal computers, cell phones, digital cameras, and other electronic equipment. The fabrication of the semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, which utilize less area or have lower heights, are developed to package the semiconductor devices.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
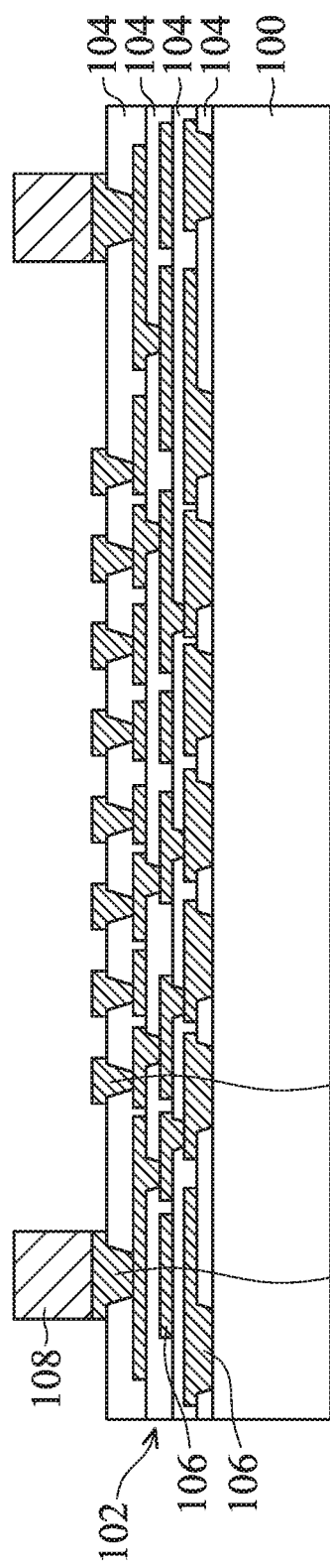
FIGS. 1A-1J are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may be applied in 3D packaging or 3D IC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The term "substantially" herein, such as in "substantially flat" or in "substantially consists", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a package structure, in accordance with some embodiments. As shown in FIG. 1A, an interconnection structure 102 is formed over the carrier substrate 100, in accordance with some embodiments. The interconnection structure 102 may be used as a redistribution structure for routing. Due to the interconnection structure 102, a package structure with a fan-out structure may be formed. The interconnection structure 102 includes multiple insulating layers 104 and multiple conductive features 106, as shown in FIG. 1A. The conductive features 106 may include conductive lines, conductive vias, and/or conductive pads. The interconnection structure 102 also includes conductive features 107A and 107B that are used to hold or receive other elements such as conductive pillars or semiconductor dies.

In some embodiments, some of the conductive features 107A and 107B are exposed at or protrude from the topmost surface of the insulating layers 104. The exposed or protruding conductive features 107A and 107B may serve as bonding pads where conductive bumps (such as tin-containing solder bumps) and/or conductive pillars (such as copper pillars) will be formed later.

The insulating layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, graphene, one or more other suitable conductive materials, or a combination thereof.

The formation of the interconnection structure 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof. In some other embodiments, the planarization process is not performed.

However, many variations and/or modifications can be made to embodiments of the disclosure. In some other embodiments, the interconnection structure 102 is not formed.

Afterwards, conductive structures 108 are formed over the conductive features 107A, as shown in FIG. 1A in accordance with some embodiments. In some embodiments, the conductive structures 108 are used for signal transmission. In some embodiments, the conductive structures 108 are conductive pillars. In some embodiments, the conductive structures 108 have substantially straight sidewalls. The sidewalls of the conductive structures 108 may be substantially perpendicular to the top surface of the carrier substrate 100. The conductive structures 108 may be made of or include copper, aluminum, titanium, cobalt, gold, tin-containing alloys, one or more other suitable materials, or a combination thereof.

The conductive structures 108 may be formed using an electroplating process, an electroless plating process, a PVD process, a CVD process, one or more other applicable processes, or a combination thereof. In some other embodiments, the conductive structures 108 are picked and placed onto the exposed conductive features 107A. Tin-containing solder elements may be used to affix the conductive structures 108.

Figure 1B:
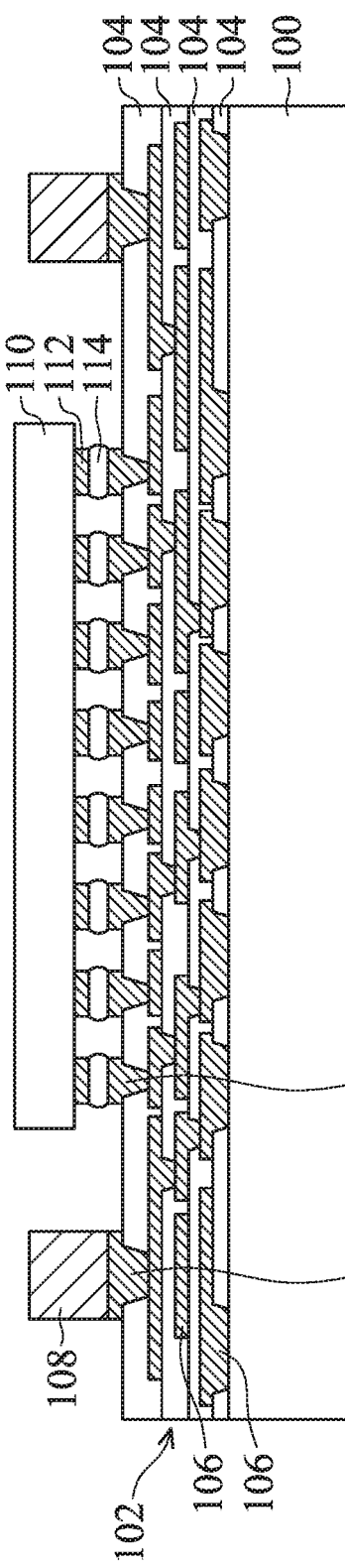

As shown in FIG. 1B, a semiconductor device such as a semiconductor die 110 is disposed over the carrier substrate 100, in accordance with some embodiments. In some embodiments, the semiconductor die 110 is disposed onto the exposed conductive features 107B. The semiconductor die 110 may be a system-on-chip (SoC) chip. In some other embodiments, the element 110 is a system on integrated circuit (SoIC) device that includes two or more chips with integrated function. In these cases, the reference number "110" is used to designate a semiconductor device. The semiconductor device may include one die, multiple dies, or system-on-integrated-circuit chip device. For example, the element 110 includes a stack of multiple semiconductor dies.

In some embodiments, the semiconductor die 110 is disposed over the interconnection structure 102 formed over the carrier substrate 100. In some embodiments, the semiconductor die 110 is bonded to the conductive features 107B of the interconnection structure 102 through bonding structures 114. The bonding structures 114 may physically and electrically connect the conductive features 107B and conductive features 112 of the semiconductor die 110. The conductive features 112 of the semiconductor die 110 may include conductive pads, conductive pillars, conductive traces, or the like.

In some embodiments, the bonding structures 114 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free. The formation of the bonding structures 114 may involve one or more reflow processes and/or one or more plating processes.

Figure 1C:
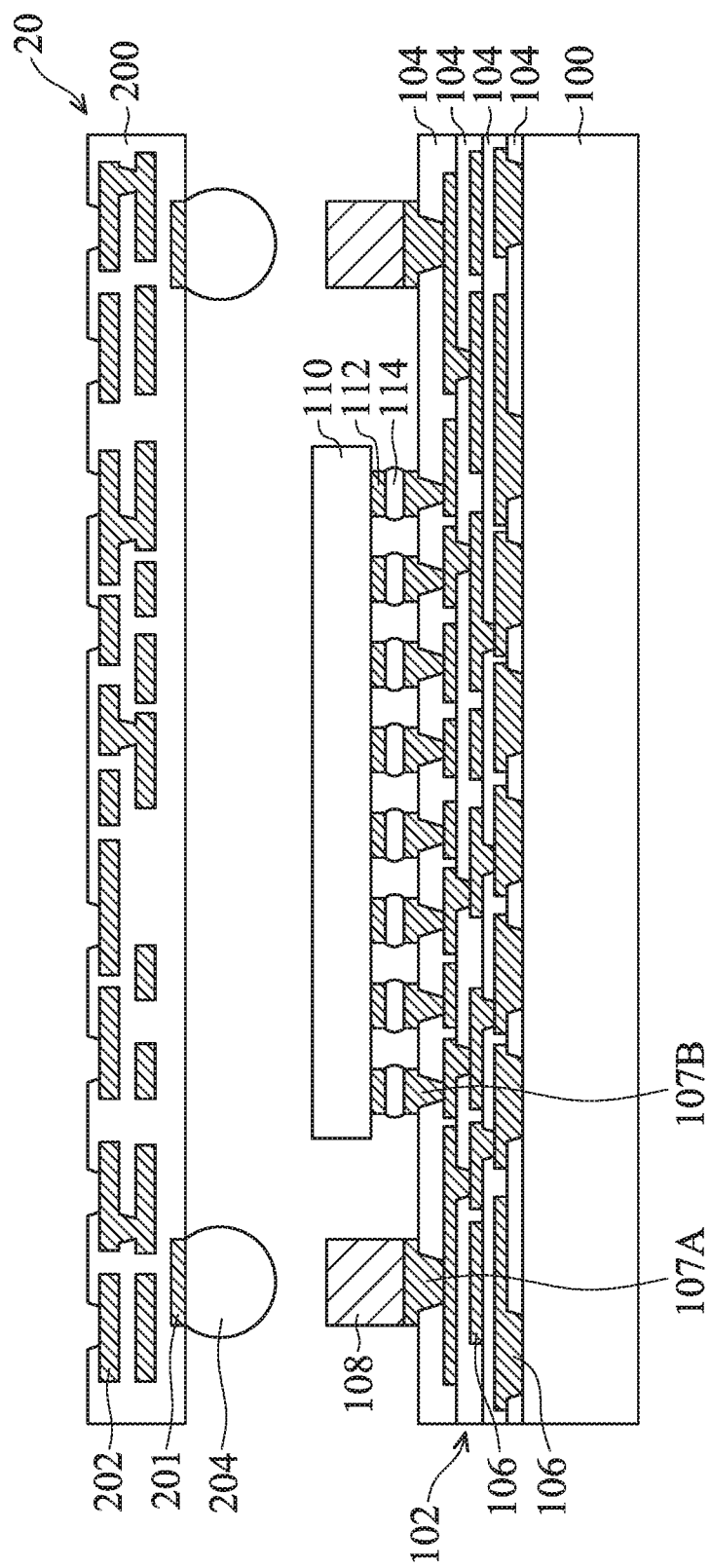

As shown in FIG. 1C, a protective substrate 20 is provided or received and is ready to be bonded onto the conductive structures 108, in accordance with some embodiments. In some embodiments, the protective substrate 20 includes a board 200 and conductive elements 202. The board 200 and the conductive elements 202 together form a redistribution structure that may be used for routing. The board 200 may be made of or include a polymer material, a ceramic material, a semiconductor material, a metal material, one or more other suitable materials, or a combination thereof.

For example, the board 200 includes resin, prepreg, glass, and/or ceramic. In the cases where the board 200 is made of a metal material or a semiconductor material, dielectric layers may be formed between the board 200 and the conductive elements 202 to prevent short circuiting.

In some embodiments, the protective substrate 20 includes conductive bumps 204. In some embodiments, the conductive bumps 204 are solder elements made of, for example, a tin-containing solder material. The tin-containing solder material may further include copper, silver, gold, aluminum, lead, one or more other suitable materials, or a combination thereof. In some embodiments, the tin-containing solder material is lead free.

The formation of the conductive bumps 204 may involve one or more plating processes (such as electroplating processes) and/or one or more reflow processes. The protective substrate 20 also includes conductive features 201 that are used to hold or receive other elements such as the conductive bumps 204.

As shown in FIG. 1C, the protective substrate 20 is positioned to allow the conductive bumps 204 to be substantially aligned with the conductive structures 108, in accordance with some embodiments. As mentioned above, in some embodiments, the conductive bumps 204 are tin-containing solder elements which may facilitate a subsequent bonding process.

Figure 1D:
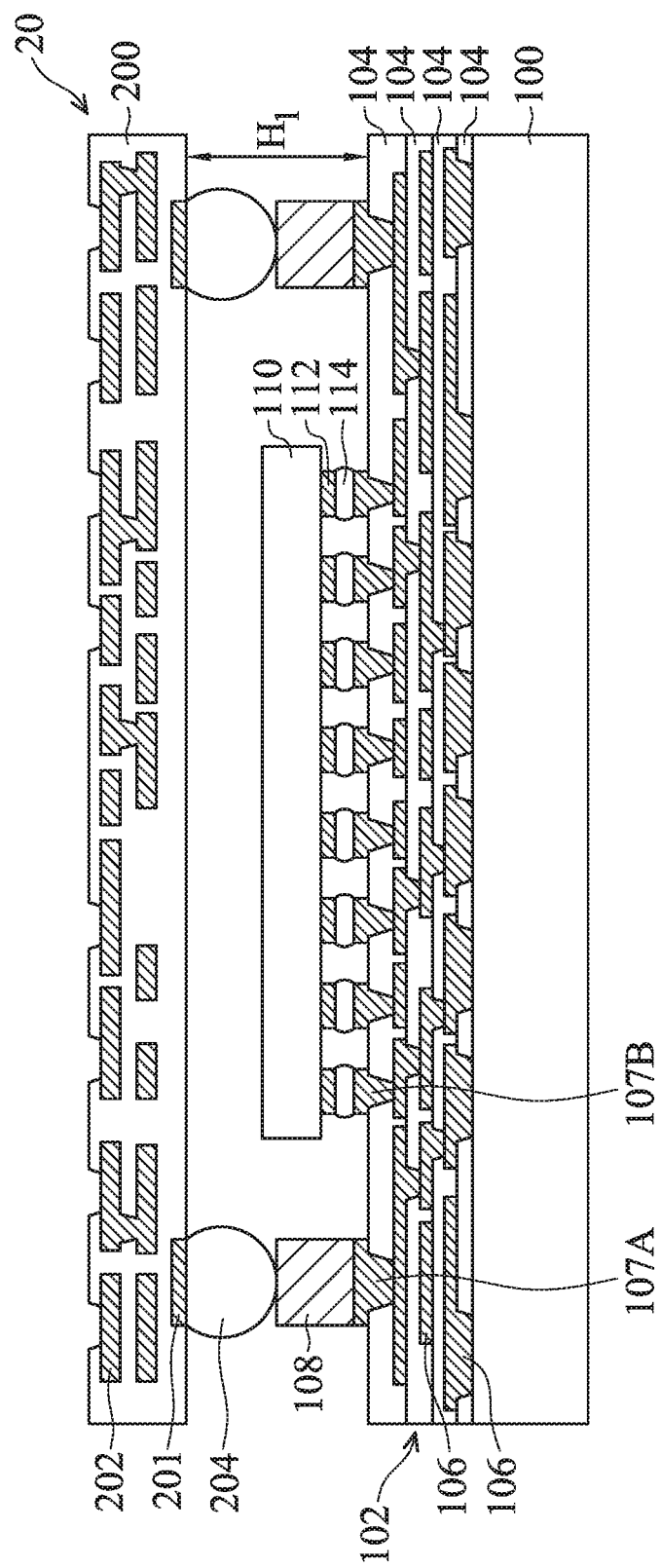

As shown in FIG. 1D, the protective substrate 20 is disposed over the carrier substrate 100 to allow conductive structures (such as the conductive bumps 204) of the protective substrate 20 to be in direct contact with the conductive structures 108, in accordance with some embodiments. As shown in FIG. 1D, the bottom surface of the board 200 is separated from the top surface of the interconnection structure 102 by a distance $H_1$. In some cases, the distance $H_1$ may be varied at different positions since some of the conductive structures 108 and/or the conductive bumps 204 have different heights.

Figure 1E:
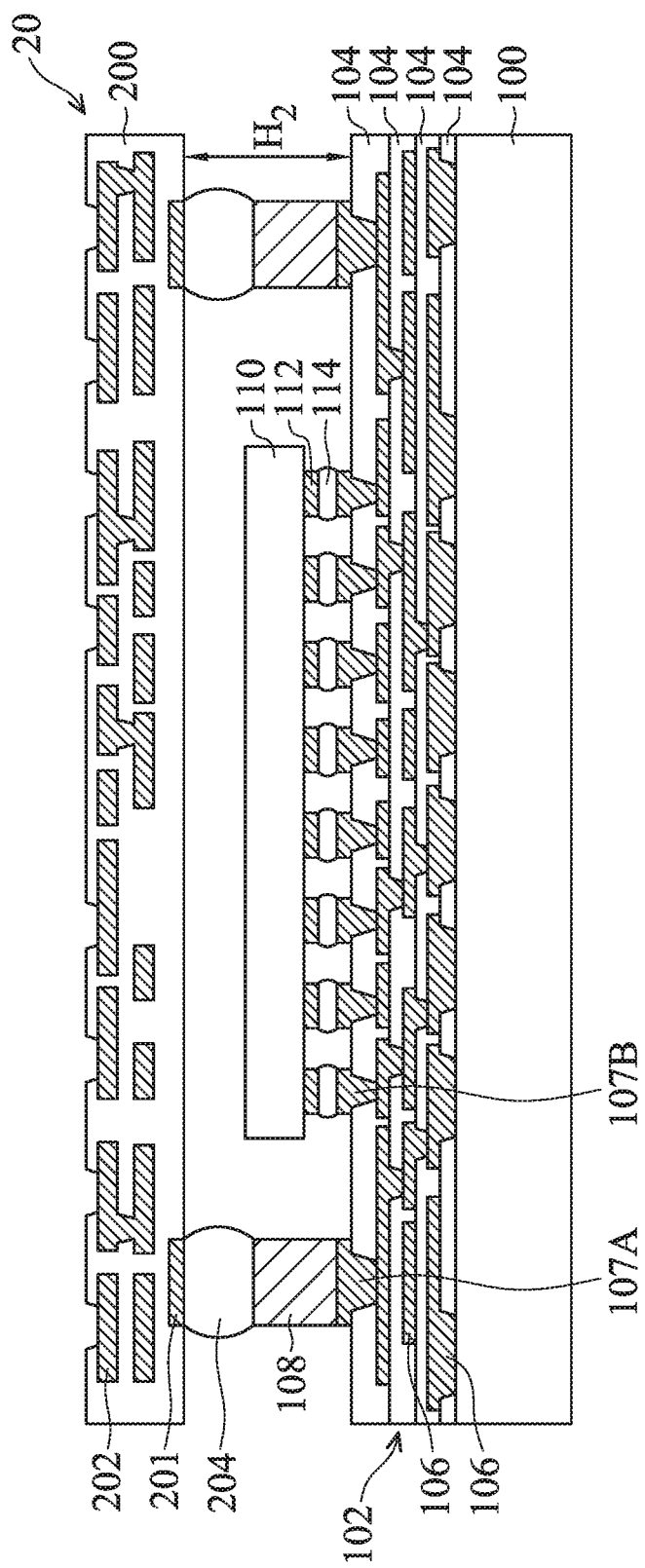

As shown in FIG. 1E, a thermal reflow process is used to affix the protective substrate 20 and the conductive structures 108, in accordance with some embodiments. As mentioned above, in some embodiments the conductive bumps 204 are tin-containing solder bumps. In these cases, solder joints may be formed between the conductive bumps 204 and the conductive structures 108 so as to affix the protective substrate 20 and the conductive structures 108. As shown in FIG. 1E, after the thermal reflow process, the bottom surface of the board 200 is separated from the top surface of the interconnection structure 102 by a distance $H_2$. In some embodiments, the distance $H_2$ is slightly shorter than the distance $H_1$.

Figure 1F:
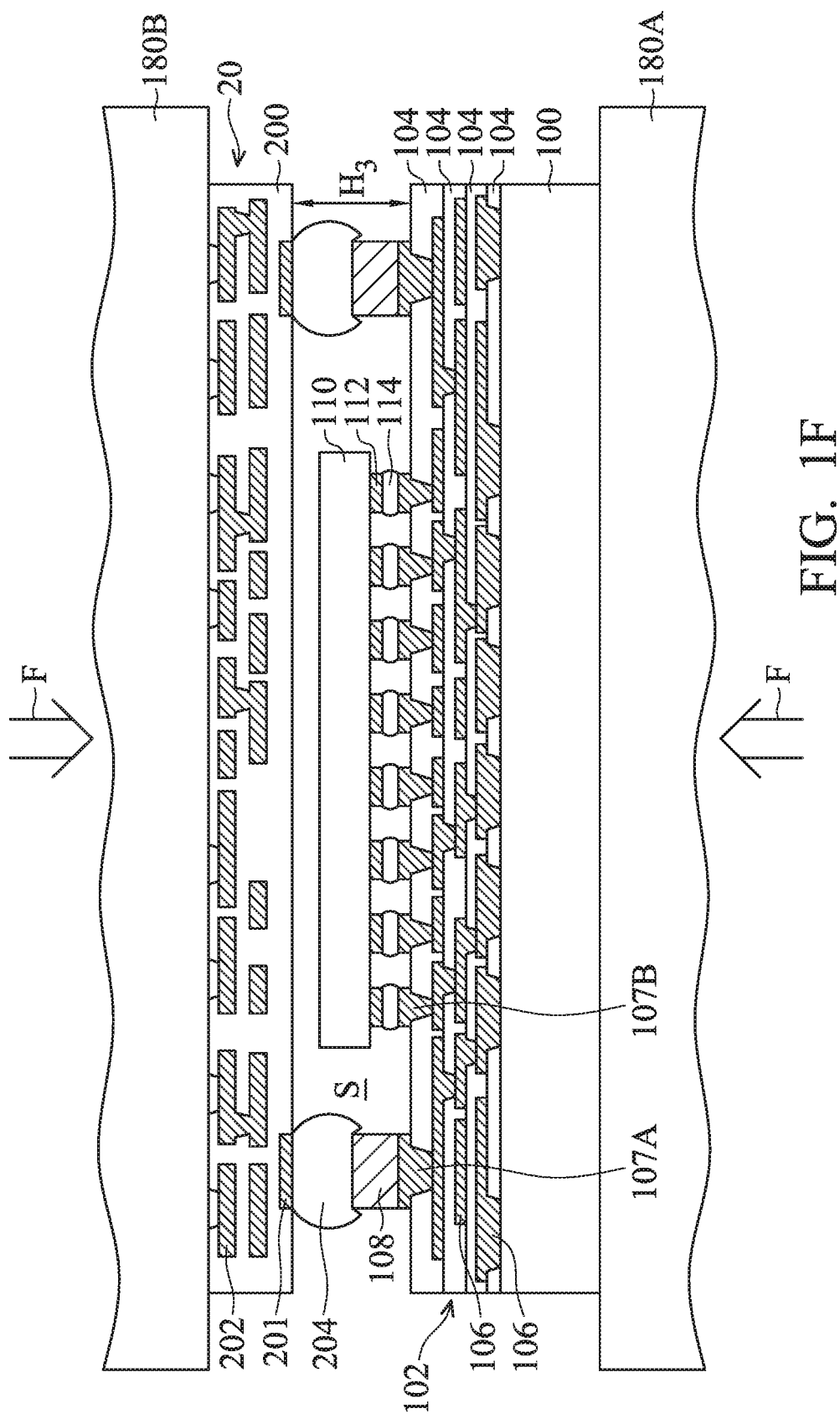

As shown in FIG. 1F, the protective substrate 20 and the carrier substrate 100 are pressed against each other at an elevated temperature, in accordance with some embodiments. As a result, the protective substrate 20 is bonded to the conductive structures 108. In some embodiments, a thermal compression process is used to achieve the bonding process mentioned above. As shown in FIG. 1F, after the thermal compression process, the distance between the bottom surface of the board 200 and the top surface of the interconnection structure 102 is reduced from the distance $H_2$ to the distance $H_3$. A space S is defined between the protective substrate 20 and the carrier substrate 100, as shown in FIG. 1F. Due to the thermal compression process, bonding structures constructed by the conductive bumps 204 and the conductive structures 108 may have a substantially uniform joint height.

In some embodiments, molding elements 180A and 180B are used to apply compression force F to the protective substrate 20 and the carrier substrate 100 at an elevated temperature. In some embodiments, the elevated temperature is higher than about 120 degrees C. and lower than the melting point of the conductive bump 204. In some embodiments, the elevated temperature is in a range from about 120 degrees C. to about 200 degrees C. In some other embodiments, the elevated temperature is in a range from about 150 degrees C. to about 180 degrees C.

At elevated temperatures, the conductive bumps 204 may become softer than their original state at room temperature. Therefore, the softer conductive bumps 204 may be pressed towards the conductive structures 108 more easily by the molding elements 180A and 180B. Even if some of the conductive structures 108 and/or the conductive bumps 204 have different heights, the thermal compression process may allow the thermally pressed conductive structures 108 and the conductive bumps 204 to have substantially the same height. The height $H_3$ is therefore substantially uniform at different positions of the package structure, which facilitates subsequent processes.

In some cases, if the elevated temperature is lower than about 120 degrees C., the conductive bumps 204 may not be soft enough. As a result, the molding elements 180A and 180B may not be able to press the conductive bumps 204 towards the conductive structures 108. The height $H_3$ may not be uniform at different positions.

In some other cases, if the elevated temperature is higher than about 200 degrees C., the conductive bumps 204 may become too soft. The conductive bumps 204 may not be able to sustain the applied compression force F and might collapse. The height $H_3$ may still not be uniform at different positions.

Figure 3:
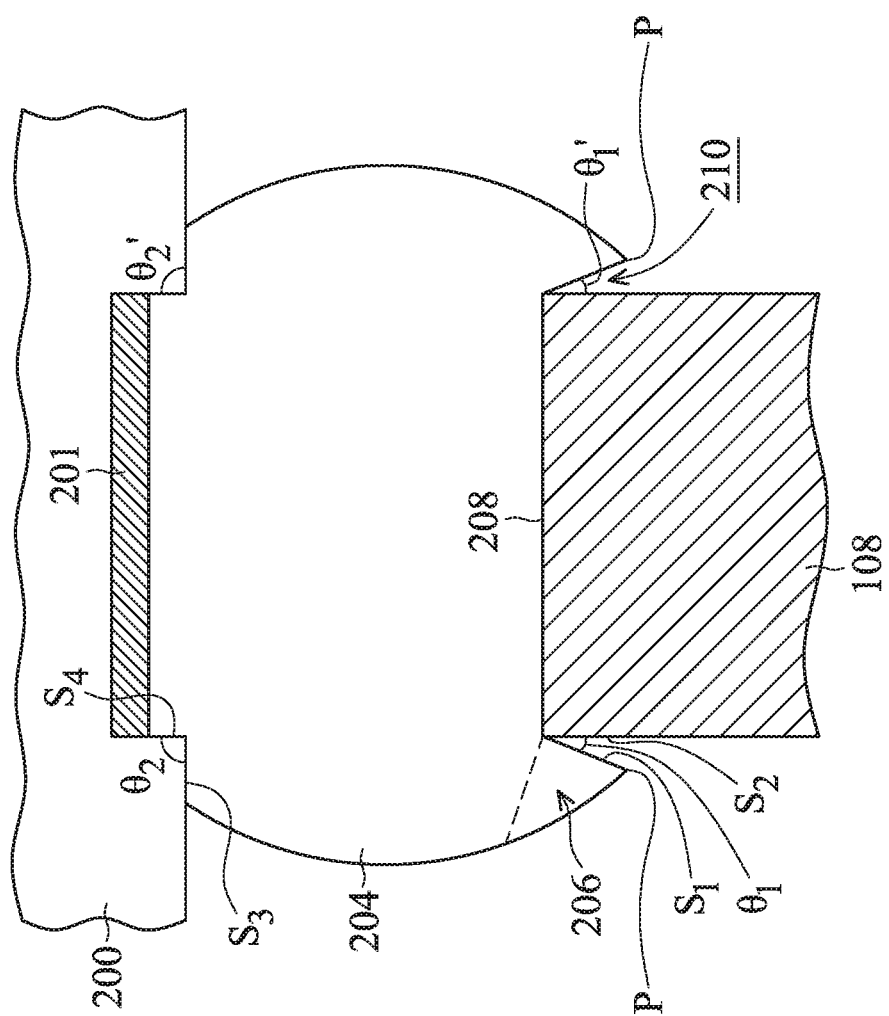
FIG. 3 is a cross-sectional view of a portion of a package structure, in accordance with some embodiments.

FIG. 3 is a cross-sectional view of a portion of a package structure, in accordance with some embodiments. In some embodiments, FIG. 3 is an enlarged view showing a portion of the package structure shown in FIG. 1F.

In some embodiments, due to the characteristics of the thermal compression process, the conductive bumps 204 are pressed to form protruding portions 206, as shown in FIG. 3. Each of the protruding portions 206 extends downwards from the interface 208 between the corresponding conductive bump 204 and the corresponding conductive structure 108, as shown in FIG. 3 in accordance with some embodiments.

In some embodiments, the protruding portion 206 partially overlaps or partially covers the sidewall $S_2$ of the conductive structure 108 with an observation direction perpendicular to the sidewall $S_2$ of the conductive structure 108, as shown in FIG. 3. As shown in FIG. 3, the protruding portion 206 has an inner sidewall $S_1$. In some embodiments, the inner sidewall $S_1$ of the protruding portion 206 is separated from the sidewall S2 of the conductive structure 108.

A recess 210 is defined by the inner sidewall $S_1$ of the protruding portion 206 and the sidewall S2 of the conductive structure 108, as shown in FIG. 3. In some embodiments, the protruding portion 206 of the conductive bump 204 continuously surrounds the recess 210. In some embodiments, the recess 210 continuously surrounds a portion of the conductive structure 108.

Figure 4:
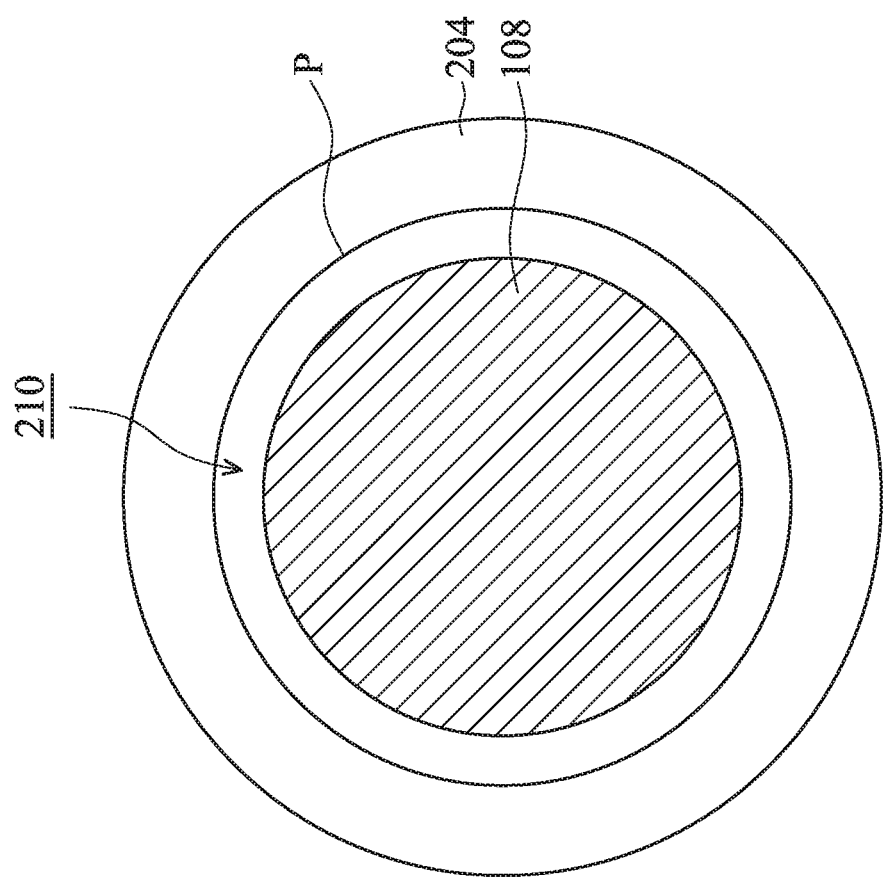
FIG. 4 is a top view of a portion of a package structure, in accordance with some embodiments.

FIG. 4 is a top view of a portion of a package structure, in accordance with some embodiments. In some embodiments, FIG. 4 shows a top view of the conductive structure 108 and the conductive bump 204 with an observation direction from the bottom of the conductive structure 108 towards the conductive bump 204. For simplicity and clarity, only the conductive structure 108 and the conductive bump 204 are illustrated in FIG. 4.

In FIG. 4, the circle P shows the top view of the bottommost portion of the protruding portion 206. As shown in FIG. 4, the bottom of the protruding portion 206 of the conductive bump 204 continuously surrounds the recess 210 and the conductive structure 108. In some embodiments, the recess 210 continuously surrounds a portion of the conductive structure 108.

In some embodiments, the inner sidewall $S_1$ of the protruding portion 206 and the sidewall $S_2$ of the conductive structure 108 together define an angle $\theta_1$, as shown in FIG. 3. In some embodiments, the angle $\theta_1$ is an acute angle. In some embodiments, the angle $\theta_1$ is in a range from about 5 degrees to about 25 degrees. In some other embodiments, the angle $\theta_1$ is in a range from about 10 degrees to about 20 degrees.

As shown in FIG. 3, the conductive bump 204 also includes side surfaces $S_3$ and $S_4$ at a corner portion of the conductive bump 204 near the conductive feature 201. The side surfaces $S_3$ and $S_4$ together define an angle $\theta_2$, as shown in FIG. 3. In some embodiments, the angle $\theta_2$ is substantially equal to 90 degrees. In some other embodiments, the angle $\theta_2$ is greater than 90 degrees. The angle $\theta_2$ may be in a range from about 90 degrees to about 140 degrees.

Figure 7:
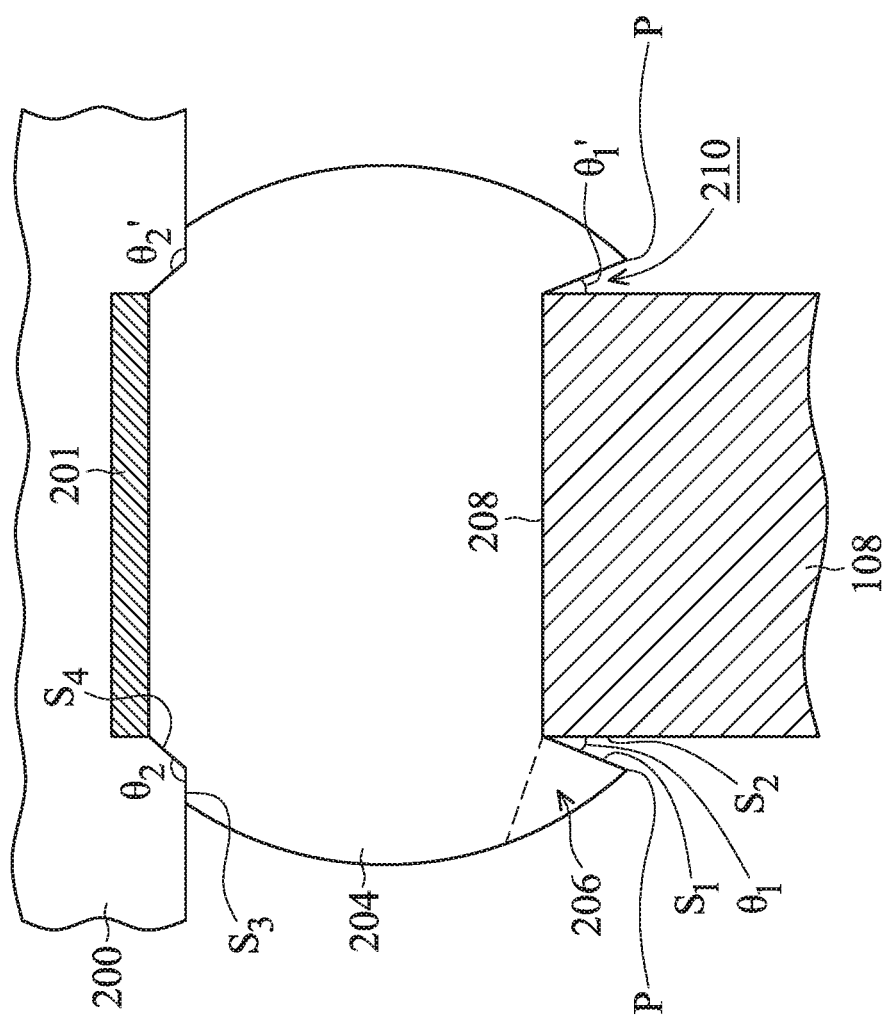
FIG. 7 is a cross-sectional view of a portion of a package structure, in accordance with some embodiments.

FIG. 7 is a cross-sectional view of a portion of a package structure, in accordance with some embodiments. In some embodiments, FIG. 7 is an enlarged view showing a portion of the package structure shown in FIG. 1F. In some embodiments, an opening of the board 200 that exposes the conductive feature 201 has slanted sidewalls. In these cases, the angle $\theta_2$ is greater than 90 degrees.

As shown in FIG. 3 or FIG. 7, similar to the angles $\theta_1$ and $\theta_2$, angles $\theta_1'$ and $\theta_2'$ are also defined on the opposite side of the conductive bump 204. In some embodiments, the angle $\theta_1'$ is substantially equal to the angle $\theta_1$. In some other embodiments, the angles $\theta_1$ and $\theta_1'$ are different from each other. In some embodiments, the angle $\theta_2'$ is substantially equal to the angle $\theta_2$. In some other embodiments, the angles $\theta_2$ and $\theta_2'$ are different from each other.

Many variations and/or modifications can be made to embodiments of the disclosure. In some other embodiments, one or both of the angles $\theta_1$ and $\theta_1'$ has/have a different angle range. For example, one or both of the angles $\theta_1$ and $\theta_1'$ may be greater than about 90 degrees. One or both of the angles $\theta_1$ and $\theta_1'$ may be in a range from about 90 degrees to about 140 degrees.

Figure 1G:
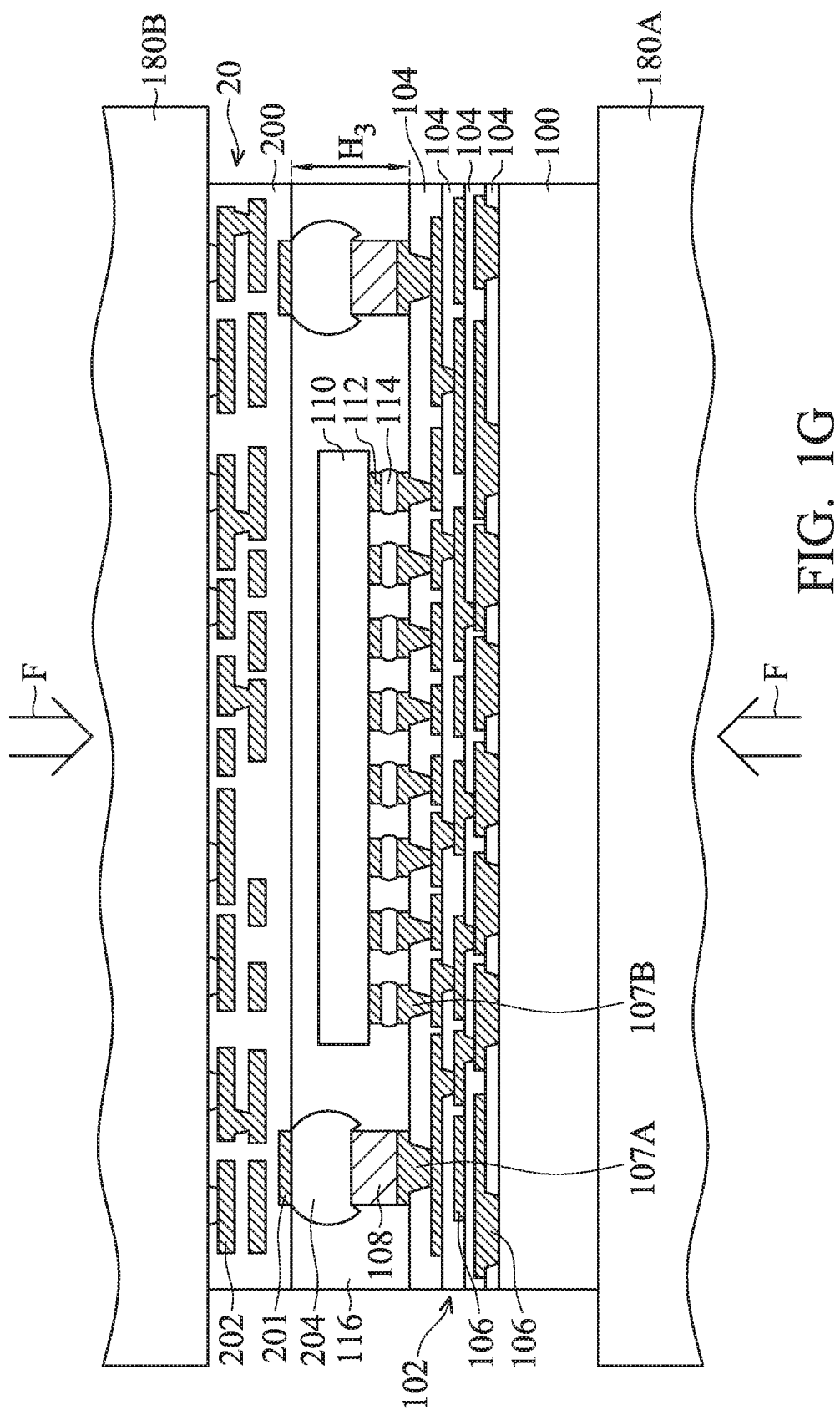

Referring to FIG. 1G, a protective layer 116 is formed to surround the semiconductor die 110 and the conductive structures 108, in accordance with some embodiments. In some embodiments, the protective layer 116 is in direct contact with the conductive structures 108 and the conductive bumps 204. In some embodiments, the protective layer 116 is in direct contact with the semiconductor die 110. In some embodiments, a portion of the protective layer 116 fills the recess 210 defined by the protruding portions 206 and the conductive structures 108. In some embodiments, the protective layer 116 is in direct contact with the inner sidewalls $S_1$ of the protruding portions 206.

In some embodiments, the protective layer 116 is made of or includes an insulating material such as a molding material. The molding material may include a polymer material, such as an epoxy-based resin with fillers dispersed therein. In some embodiments, a molding material (such as a liquid molding material) is introduced or injected into the space S between the protective substrate 20 and the carrier substrate 100. In some embodiments, the molding material is introduced to surround the semiconductor die 110 while the protective substrate 20 and the carrier substrate 100 are pressed against each other at an elevated temperature.

In some embodiments, a thermal process is then used to cure the liquid molding material and to transform it into the protective layer 116. In some other embodiments, the liquid molding material is cured between the molding elements 180A and 180B at an elevated temperature. Alternatively, the temperature may be increased to cure the liquid molding material. Because the protective layer 116 is formed during the thermal compression process, the compression force F from the molding elements 180A and 180B may be used to reduce warpage caused due to thermal expansion differences between different materials. Interface adhesion between different materials may be greatly enhanced since all elements are kept stable by the molding elements 180A and 180B. The quality and reliability of the formed package structure are significantly improved.

Figure 1H:
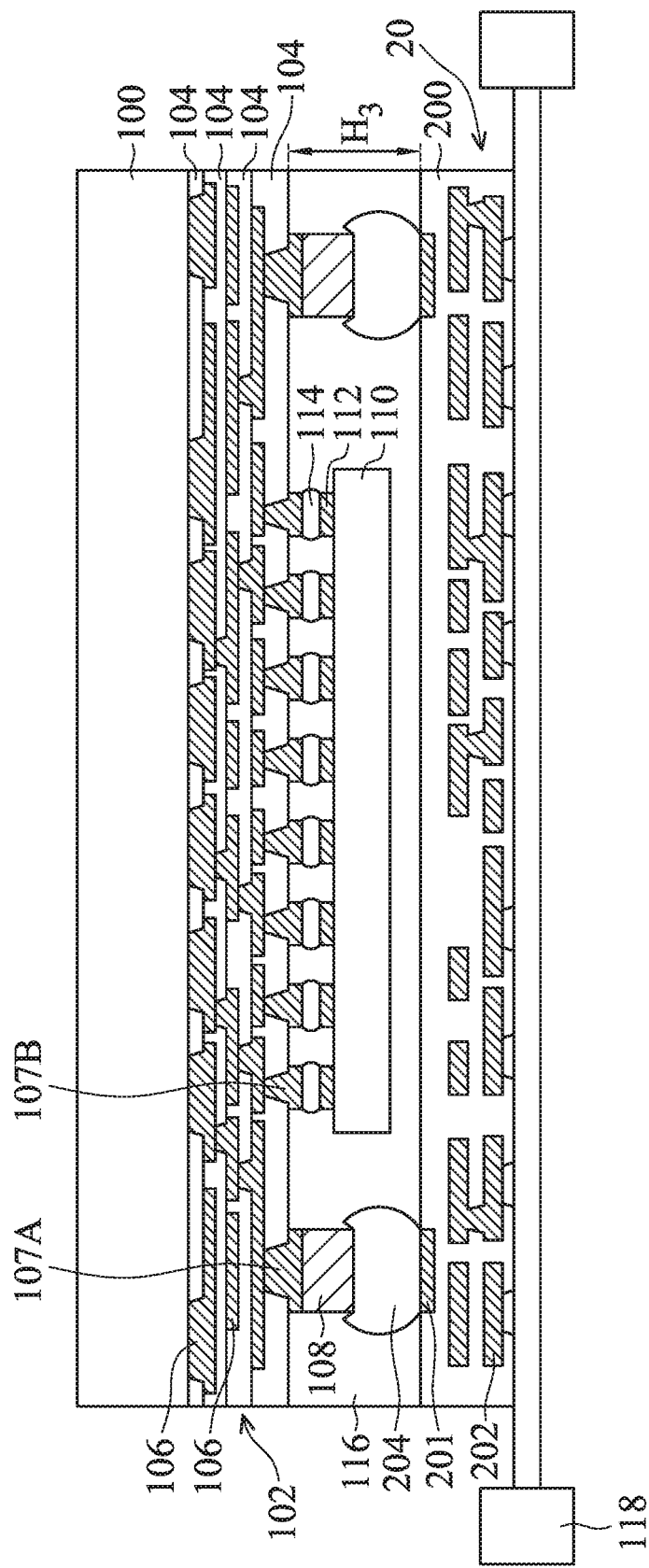

In some embodiments, after the formation of the protective layer 116, the formed package structure is removed from the molding elements 180A and 180B. Afterwards, the formed package structure is turned upside down and disposed onto a tape carrier 118, as shown in FIG. 1H in accordance with some embodiments.

Figure 1I:
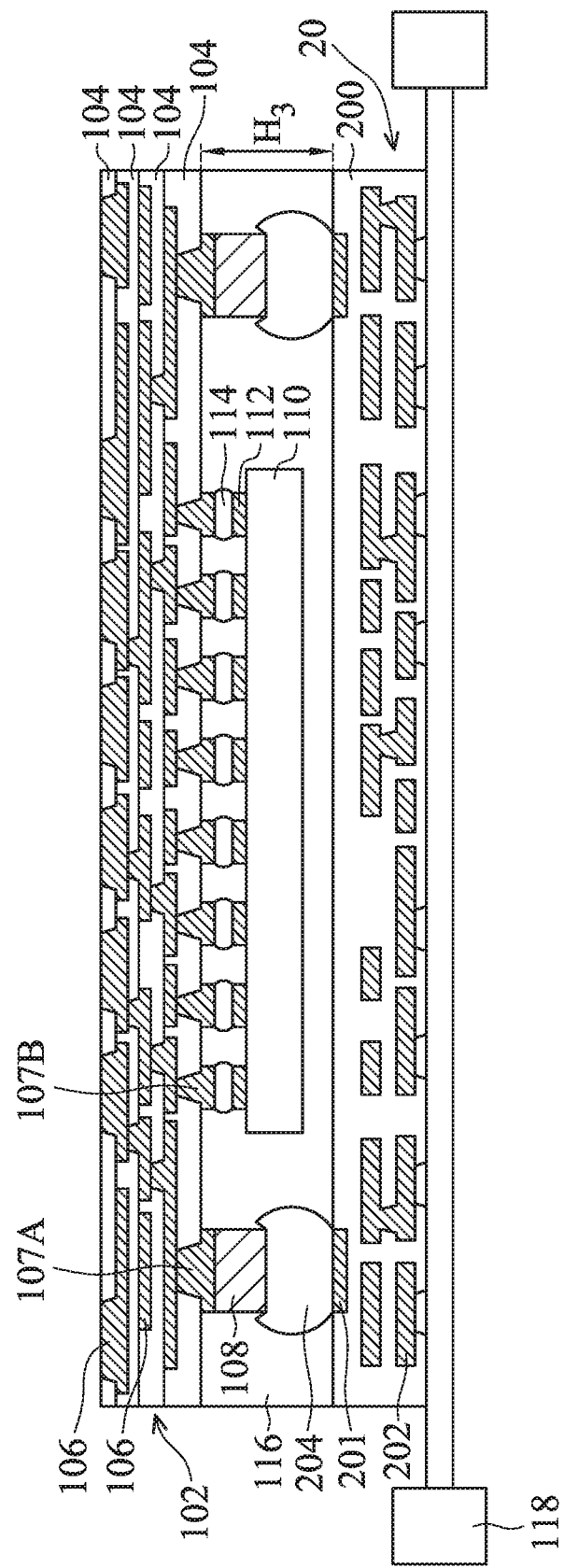
Figure 1J:
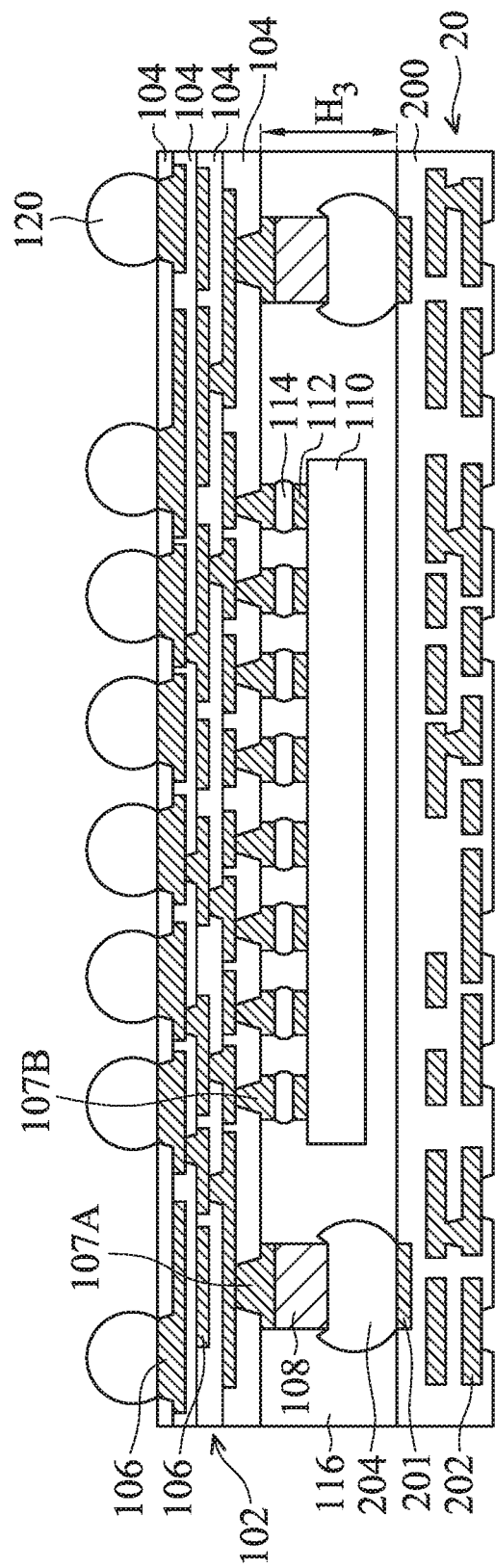

As shown in FIG. 1I, the carrier substrate 100 is removed, in accordance with some embodiments. Afterwards, conductive bumps 120 are formed, as shown in FIG. 1J in accordance with some embodiments. In some embodiments, the conductive bumps 120 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free.

In some embodiments, solder balls (or solder elements) are disposed onto the exposed conductive features 106 after the removal of the carrier substrate 100. A reflow process is then carrier out to melt the solder balls into the conductive bumps 120. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 120. In some embodiments, a singulation process is then carrier out to saw through the formed structure. As a result, multiple separate package structures are formed. Afterwards, the tape carrier 118 is removed. In FIG. 1J, one of the package structures is shown.

Figure 2A:
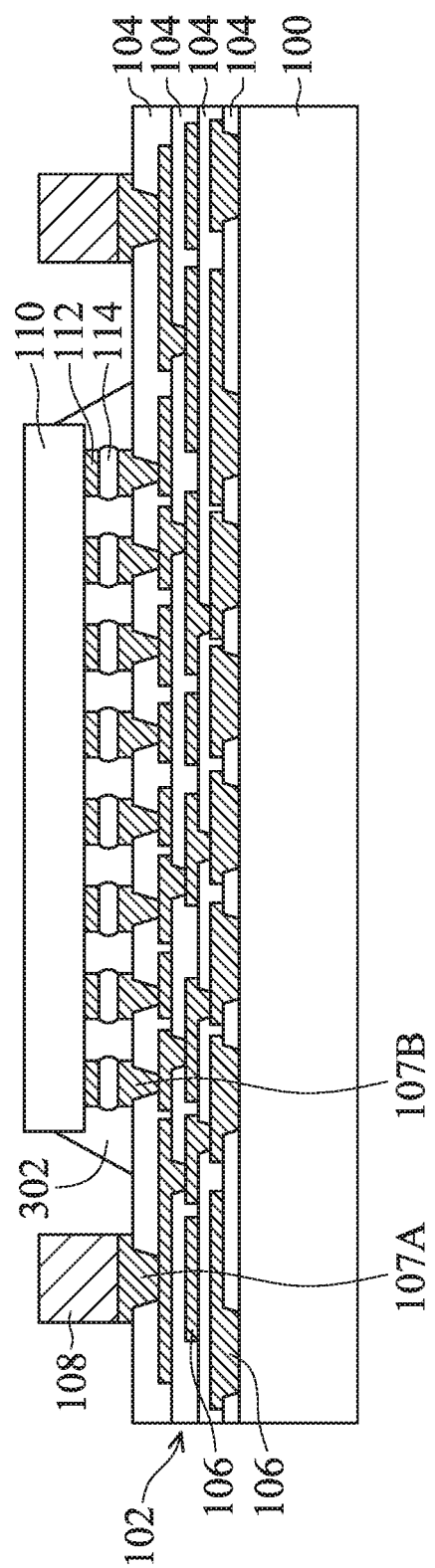
FIGS. 2A-2B are cross-sectional views of various stages of a process for forming a package structure, in accordance with some embodiments.
Figure 2B:
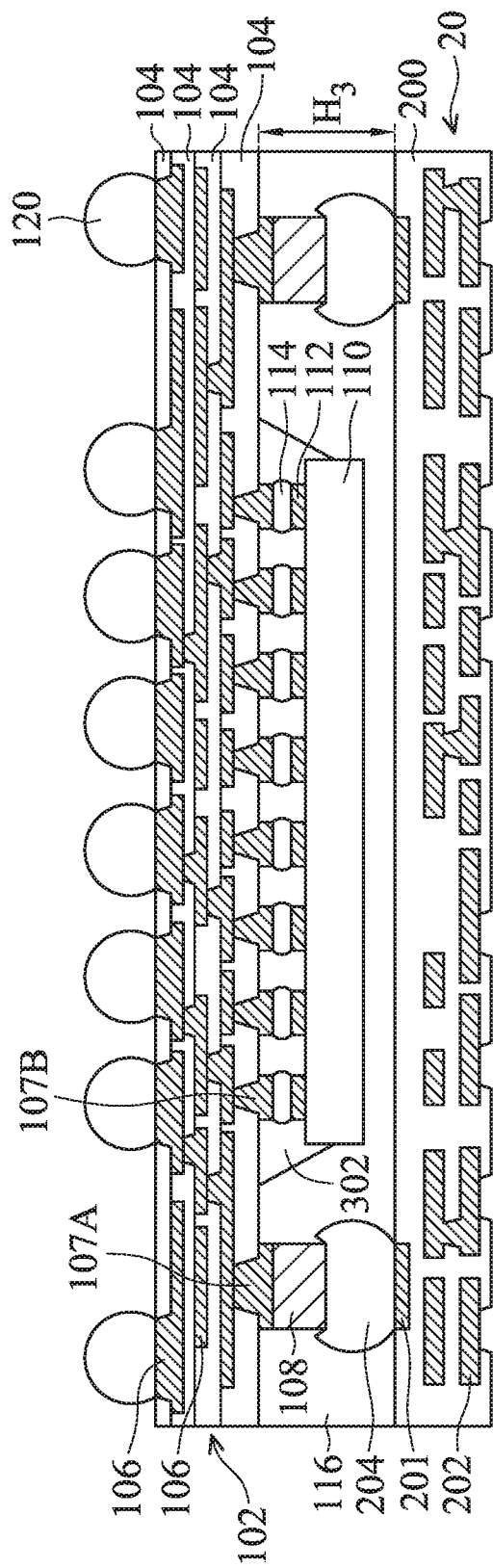

Many variations and/or modifications can be made to embodiments of the disclosure. FIGS. 2A-2B are cross-sectional views of various stages of a process for forming a package structure, in accordance with some embodiments. As shown in FIG. 2A, a structure similar to the structure shown in FIG. 1B is provided or formed, in accordance with some embodiments.

As shown in FIG. 2A, an underfill layer 302 is formed to protect the bonding structures 114, in accordance with some embodiments. The underfill layer 302 is made of or includes one or more polymer materials. The underfill layer 302 may include an epoxy-based resin. In some embodiments, the underfill layer 302 further includes fillers dispersed in the epoxy-based resin. In some embodiments, the formation of the underfill layer 302 involves an injecting process, a dispensing process, a film lamination process, an application process, one or more other applicable processes, or a combination thereof. In some embodiments, a thermal curing process is then used to complete the formation of the underfill layer 302.

Afterwards, processes similar to those illustrated in FIGS. 1C-1J are performed to form a package structure, as shown in FIG. 2B in accordance with some embodiments. In some embodiments, the bonding structures 114 are not in direct contact with the protective layer 116. The bonding structures 114 are separated from the protective layer 116 by the underfill layer 302.

Figure 5:
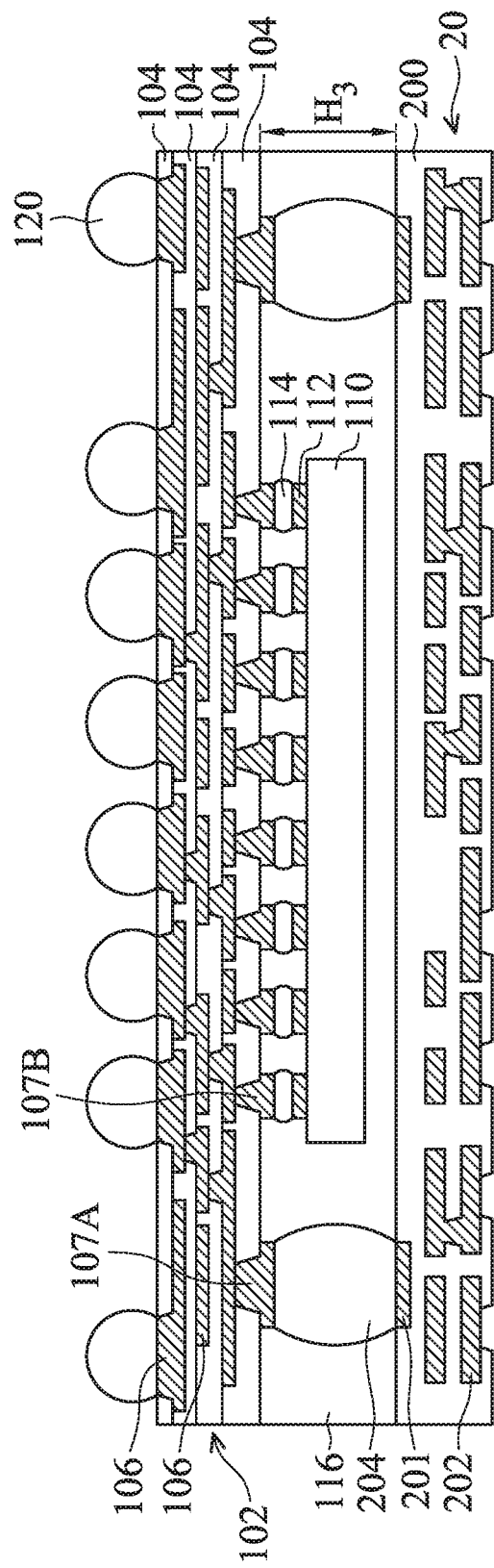
FIG. 5 is a cross-sectional view of a package structure, in accordance with some embodiments.

Many variations and/or modifications can be made to embodiments of the disclosure. In some other embodiments, the conductive structure 108 is not formed. FIG. 5 is a cross-sectional view of a package structure, in accordance with some embodiments. As shown in FIG. 5, the conductive bumps 204 are bonded to the exposed conductive features 106 of the interconnection structure 102.

Many variations and/or modifications can be made to embodiments of the disclosure. In some other embodiments, similar to the embodiments illustrated in FIG. 2B, an underfill layer is formed to protect the bonding structures 114 before the formation of the protective layer 116. In these cases, the bonding structures 114 are not in direct contact with the protective layer 116. The bonding structures 114 are separated from the protective layer 116 by the underfill layer 302.

Figure 6:
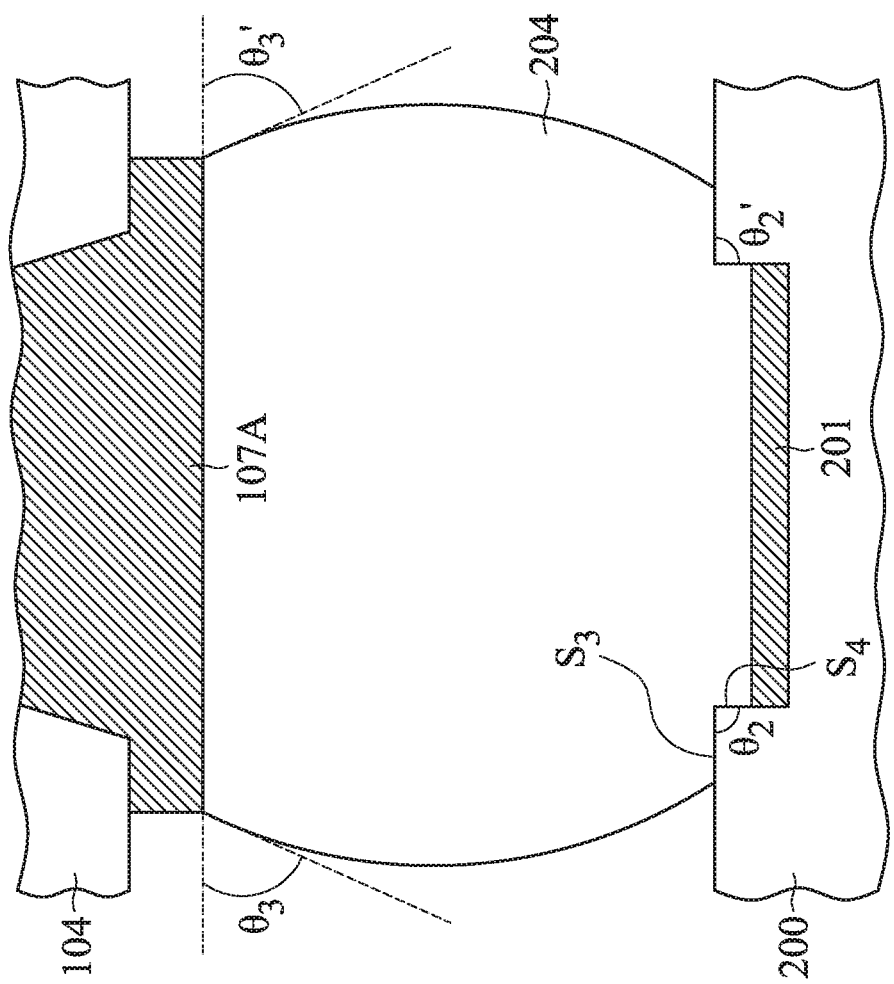
FIG. 6 is a cross-sectional view of a portion of a package structure, in accordance with some embodiments.

FIG. 6 is a cross-sectional view of a portion of a package structure, in accordance with some embodiments. In some embodiments, FIG. 6 is an enlarged view showing a portion of the package structure shown in FIG. 5.

As shown in FIG. 6, a surface of the conductive bump 204 near the conductive feature 107A and a surface of the conductive feature 107A together define an angle $\theta_3$. In some embodiments, the angle $\theta_3$ is an acute angle. In some embodiments, the angle $\theta_3$ is in a range from about 30 degrees to about 60 degrees. In some other embodiments, the angle $\theta_3$ is in a range from about 40 degrees to about 50 degrees.

As shown in FIG. 6, the conductive bump 204 includes side surfaces $S_3$ and $S_4$ at a corner portion of the conductive bump 204 near the conductive feature 201. The side surfaces $S_3$ and $S_4$ together define an angle $\theta_2$, as shown in FIG. 6. In some embodiments, the angle $\theta_2$ is substantially equal to 90 degrees. In some other embodiments, the angle $\theta_2$ is greater than 90 degrees. The angle $\theta_2$ may be in a range from about 90 degrees to about 140 degrees.

As shown in FIG. 6, similar to the angles $\theta_3$ and $\theta_2$, angles $\theta_3'$ and $\theta_2'$ are also defined on the opposite side of the conductive bump 204. In some embodiments, the angle $\theta_3'$ is substantially equal to the angle $\theta_3$. In some other embodiments, the angles $\theta_3$ and $\theta_3'$ are different from each other. In some embodiments, the angle $\theta_2'$ is substantially equal to the angle $\theta_2$. In some other embodiments, the angles $\theta_2$ and $\theta_2'$ are different from each other.

Embodiments of the disclosure form a package structure using a thermal compression process. A semiconductor die is disposed over a carrier substrate with conductive pillars formed thereon. A protective substrate is bonded onto the conductive pillars through solder bumps using the thermal compression process. Due to the characteristics of the thermal compression process, the solder bumps are pressed towards the conductive pillars to ensure that each of the bonding structures including the solder bumps and the conductive pillars are controlled to have substantially the same height. A protective layer is then formed to surround the semiconductor die while the thermal compression process is still applied to the carrier substrate and the protective substrate. Because the protective layer is formed during the thermal compression process, the warpage of the package structure would be significantly reduced. Interface adhesion between different materials may be greatly enhanced since all elements are kept stable. The quality and reliability of the formed package structure are significantly improved.

In accordance with some embodiments, a method for forming a package structure is provided. The method includes forming a conductive structure over a carrier substrate and disposing a semiconductor die over the carrier substrate. The method also includes pressing a protective substrate against the carrier substrate at an elevated temperature to bond the protective substrate to the conductive structure. The method further includes forming a protective layer to surround the semiconductor die.

In accordance with some embodiments, a method for forming a package structure is provided. The method includes forming a first conductive structure over a carrier substrate and disposing a semiconductor die over the carrier substrate. The method also includes disposing a protective substrate over the carrier substrate and the semiconductor die. As a result, a second conductive structure of the protective substrate is in direct contact with the first conductive structure. The method further includes pressing the protective substrate and the carrier substrate against each other at an elevated temperature to reduce a distance between the carrier substrate and the protective substrate. In addition, the method includes forming a protective layer to surround the semiconductor die.

In accordance with some embodiments, a package structure is provided. The package structure includes a first redistribution structure and a second redistribution structure over the first redistribution structure. The package structure also includes a semiconductor die between the first redistribution structure and the second redistribution structure. The package structure further includes a protective layer surrounding the semiconductor die. In addition, the package structure includes a conductive structure penetrating through the protective layer. The conductive structure has a solder element and a conductive pillar. The solder element has a protruding portion extending downwards from an interface between the conductive pillar and the solder element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a package structure, comprising:
   forming a conductive structure over a carrier substrate;
   disposing a semiconductor die over the carrier substrate;

disposing a protective substrate over the carrier substrate such that a solder element formed on the protective substrate is in direct contact with the conductive structure;

reflowing the solder element to affix the protective substrate and the conductive structure;

after the affixing the protective substrate and the conductive structure, pressing the protective substrate against the carrier substrate at an elevated temperature to bond the protective substrate to the conductive structure through the solder element; and forming a protective layer to surround the semiconductor die.

2. The method for forming a package structure as claimed in claim 1, wherein the formation of the protective layer comprises introducing a molding material between the protective substrate and the carrier substrate.

3. The method for forming a package structure as claimed in claim 2, wherein the molding material is introduced during the pressing the protective substrate against the carrier substrate.

4. The method for forming a package structure as claimed in claim 3, further comprising curing the molding material to form the protective layer.

5. The method for forming a package structure as claimed in claim 1, wherein the elevated temperature is in a range from about 120 degrees C. to about 200 degrees C.

6. The method for forming a package structure as claimed in claim 1, further comprising forming a redistribution structure over the carrier substrate before the conductive structure is formed and the semiconductor die is disposed.

7. The method for forming a package structure as claimed in claim 6, further comprising:

removing the carrier substrate; and forming conductive bumps on a surface the redistribution structure, wherein the surface of the redistribution structure is originally covered by the carrier substrate.

8. The method for forming a package structure as claimed in claim 6, wherein the semiconductor die is bonded to the redistribution structure through connectors, and the method further comprises forming an underfill layer to surround the connectors before the protective layer is formed.

9. The method for forming a package structure as claimed in claim 1, wherein a bottom end of the solder element is higher than a bottom of the conductive structure after the pressing the protective substrate against the carrier substrate.

10. A method for forming a package structure, comprising:

forming a first conductive structure over a carrier substrate;

disposing a semiconductor die over the carrier substrate;

disposing a protective substrate over the carrier substrate and the semiconductor die such that a second conductive structure of the protective substrate is in direct contact with the first conductive structure;

reflowing the second conductive structure to affix the first conductive structure and the second conductive structure;

after the affixing the first conductive structure and the second conductive structure, pressing the protective substrate and the carrier substrate against each other at an elevated temperature to reduce a distance between the carrier substrate and the protective substrate; and forming a protective layer to surround the semiconductor die.

11. The method for forming a package structure as claimed in claim 10, wherein at least one of the first conductive structure and the second conductive structure comprises a tin-containing solder material.

12. The method for forming a package structure as claimed in claim 11, wherein the elevated temperature is higher than about 120 degrees C. and lower than a melting point of the tin-containing solder material.

13. The method for forming a package structure as claimed in claim 10, wherein the formation of the protective layer comprises introducing a molding material into a space between the protective substrate and the carrier substrate.

14. The method for forming a package structure as claimed in claim 13, wherein the molding material is introduced during the pressing the protective substrate and the carrier substrate against each other at the elevated temperature.

15. A method for forming a package structure, comprising:

forming a conductive structure over a carrier substrate;

disposing a semiconductor die over the carrier substrate;

disposing a protective substrate over the semiconductor die such that a solder bump formed on the protective substrate is disposed directly on the conductive structure;

reflowing the solder bump to affix the conductive structure and the solder bump;

after the affixing the conductive structure and the solder bump, pressing the solder bump against the conductive structure at an elevated temperature to bond the solder bump to the conductive structure; and forming a protective layer to surround the semiconductor die.

16. The method for forming a package structure as claimed in claim 15, wherein a protruding portion of the solder bump is formed after the pressing the solder bump against the conductive structure at the elevated temperature, and the protruding portion extends towards the carrier substrate from an interface between the solder bump and the conductive structure.

17. The method for forming a package structure as claimed in claim 16, wherein the protruding portion has an inner sidewall, and the inner sidewall and a sidewall of the conductive structure form an acute angle.

18. The method for forming a package structure as claimed in claim 16, wherein the protruding portion has an inner sidewall, and the inner sidewall is separated from the conductive structure.

19. The method for forming a package structure as claimed in claim 15, wherein the elevated temperature is lower than a melting point of the solder bump.

20. The method for forming a package structure as claimed in claim 15, wherein the solder bump is laterally separated from the semiconductor die by the protective layer.

* * * * *